US011800651B2

(12) United States Patent
Utsunomiya et al.

(10) Patent No.: US 11,800,651 B2
(45) Date of Patent: Oct. 24, 2023

(54) INFORMATION DISPLAY APPARATUS

(71) Applicant: OMRON Corporation, Kyoto (JP)

(72) Inventors: Hiroki Utsunomiya, Kyoto (JP); Shinji Ezaki, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 17/837,036

(22) Filed: Jun. 10, 2022

(65) Prior Publication Data

US 2023/0009886 A1 Jan. 12, 2023

(30) Foreign Application Priority Data

Jul. 6, 2021 (JP) ................................ 2021-112181

(51) Int. Cl.
*H05K 5/00* (2006.01)
*G06F 1/16* (2006.01)

(52) U.S. Cl.
CPC ......... *H05K 5/0008* (2013.01); *G06F 1/1637* (2013.01)

(58) Field of Classification Search
CPC .. H05K 5/0008; H05K 5/0217; G06F 1/1601; G06F 1/1637
See application file for complete search history.

(56) References Cited

U.S. PATENT DOCUMENTS

| | | | |
|---|---|---|---|
| 6,172,731 B1 * | 1/2001 | Nagano | G02F 1/133308 349/150 |
| 9,915,980 B2 | 3/2018 | Park et al. | |
| 2006/0209228 A1 * | 9/2006 | Nishida | G02F 1/133308 349/59 |
| 2007/0127198 A1 * | 6/2007 | Cho | H05K 5/02 361/679.54 |
| 2007/0253150 A1 * | 11/2007 | Yue | G06F 1/1601 361/679.02 |
| 2012/0073115 A1 * | 3/2012 | Filson | H01R 43/26 29/525.01 |
| 2012/0257334 A1 * | 10/2012 | Zhao | G11B 33/124 361/679.01 |
| 2013/0235277 A1 | 9/2013 | Suwa et al. | |
| 2014/0253823 A1 * | 9/2014 | An | G06F 3/041 349/12 |
| 2014/0307393 A1 * | 10/2014 | Park | G06F 1/1656 361/727 |
| 2016/0165738 A1 * | 6/2016 | Zhu | H05K 7/1485 361/759 |
| 2021/0408668 A1 * | 12/2021 | Lee | H01Q 1/42 |
| 2022/0308374 A1 * | 9/2022 | Tsukada | G06F 1/1601 |

FOREIGN PATENT DOCUMENTS

| JP | 2002215061 | 7/2002 |
|---|---|---|
| JP | 2013190585 | 9/2013 |

OTHER PUBLICATIONS

"Search Report of Europe Counterpart Application", dated Dec. 12, 2022, pp. 1-9.

* cited by examiner

*Primary Examiner* — Sagar Shrestha
(74) *Attorney, Agent, or Firm* — JCIPRNET (57) ABSTRACT

An information display apparatus (1) includes a pair of fixing parts (50) each having a strip-like part (51) and a pair of branching parts (52). By screwing two end parts of each of the strip-like parts (51) to a front case (10) respectively, a display panel (30) is fixed, and by screwing to the two pairs of branching parts (52), a circuit substrate (40) is fixed.

6 Claims, 7 Drawing Sheets

INFORMATION DISPLAY APPARATUS

CROSS-REFERENCE TO RELATED APPLICATION

This application claims the priority benefit of Japan application serial no. 2021-112181, filed on Jul. 6, 2021. The entirety of the above-mentioned patent application is hereby incorporated by reference herein and made a part of this specification.

BACKGROUND

Technical Field

The invention relates to an information display apparatus.

Description of Related Art

Conventionally, an information display apparatus including, in an order from the front case side, a display panel, a fixing part (fixing bracket), and a circuit substrate inside a housing formed by a front case and a rear case is known. Here, with the fixing part being connected with the front case, the display panel provided between the fixing part and the front case is sandwiched and fixed. In such information display apparatus, a configuration in which the display panel can be firmly fixed with respect to the front case by screwing the fixing part to a boss provided on the front case is known (Patent Document 1).

In addition, a configuration in which the circuit substrate can be firmly fixed to the fixing part by screwing the circuit substrate to the fixing part is also known (Patent Document 2).

PRIOR ART DOCUMENTS

Patent Documents

[Patent Document 1]: Japanese Laid-open No. 2002-215061
[Patent Document 2]: Japanese Laid-open No. 2013-190585

SUMMARY

According to an aspect of the invention, an information display apparatus includes: a front case; a rear case, connected with the front case; and a display panel, a pair of fixing parts, and a circuit substrate provided inside a housing formed by the front case and the rear case. The display panel is disposed behind the front case, the pair of fixing parts are disposed behind the display panel, and the circuit substrate is disposed behind the fixing parts. Each of the fixing parts has: a strip-like part that is straight; and a pair of branching parts, which branch from a long side of the strip-like part in a direction intersecting with a longitudinal direction of the strip-like part and in which end parts provided with step differences with respect to the strip-like part are formed. Two end parts of each of the strip-like parts are respectively screwed to the front case, thereby sandwiching and fixing the display panel between the pair of fixing parts and the front case. The circuit substrate is fixed to the pair of fixing parts by being screwed to the two pairs of branching parts respectively.

DESCRIPTION OF THE EMBODIMENTS

However, the fixing part used in the conventional information display apparatus is a sheet-like bracket covering the display panel. Therefore, the information display apparatus is heavy.

An aspect of the invention is made in view of the above issue, and an objective thereof is to be able to realize an information display apparatus in which the weight can be reduced and the respective main components are firmly fixed to each other.

In order to solve the above issue, an information display apparatus according to an aspect of the invention includes: a front case; a rear case, connected with the front case; and a display panel, a pair of fixing parts, and a circuit substrate provided inside a housing formed by the front case and the rear case. The display panel is disposed behind the front case, the pair of fixing parts are disposed behind the display panel, and the circuit substrate is disposed behind the fixing parts. Each of the fixing parts has: a strip-like part that is straight; and a pair of branching parts, which branch from a long side of the strip-like part in a direction intersecting with a longitudinal direction of the strip-like part and in which end parts provided with step differences with respect to the strip-like part are formed. Two end parts of each of the strip-like parts are respectively screwed to the front case, thereby sandwiching and fixing the display panel between the pair of fixing parts and the front case. The circuit substrate is fixed to the fixing parts by being screwed to the two pairs of branching parts respectively.

According to the configuration, the fixing parts are a pair of strip-like brackets each having the strip-like part that is straight and the pair of branching parts. Therefore, compared with the sheet-like bracket covering the display panel as used in the conventional information display apparatus, the weight of the fixing parts can be reduced. In addition, the strip-like parts of the pair of fixing parts are respectively screwed to the front case. Therefore, the display panel can be fixed between the front case and the fixing parts. In addition, by contacting the branching parts of the fixing parts firmly fixed to the front case, the circuit substrate are directly screwed at four places. Therefore, the circuit substrate can be indirectly fixed to the front case. Therefore, the information display apparatus in which the weight can be reduced, and the respective main components (the front case, the display panel, the fixing parts, and the circuit substrate) are fixed to each other can be realized.

In addition, the two end parts of the strip-like part may be screwed in a direction toward the front case. According to the configuration, the strip-like parts of the pair of fixing parts are respectively screwed toward the front case. Therefore, the display panel can be effectively pressed down and firmly fixed. Moreover, by contacting the branching parts of the fixing parts firmly fixed to the front case, the circuit substrate are directly screwed at four places. Therefore, the circuit substrate can be indirectly and firmly fixed to the front case. Therefore, the information display apparatus in which the weight can be reduced, and the respective main components (the front case, the display panel, the fixing parts, and the circuit substrate) are firmly fixed to each other can be realized.

In addition, the front case may have at least two pairs of boss parts, and the two end parts of each of the strip-like parts may be respectively screwed to one pair of the boss parts. According to the configuration, with a simple configuration in which the boss parts are provided at the front case, the display panel can be firmly fixed between the display panel and the fixing part.

In addition, the fixing part may also be formed by bending a sheet-like member. According to the configuration, by processing to bend the sheet-like member, the fixing part in a strip-like shape having the pair of branching parts can be easily manufactured.

According to an aspect of the invention, an information display apparatus in which the weight can be reduced and the respective main components are firmly fixed to each other can be realized.

In the following, an embodiment (referred to as "the embodiment" in the following) according to an aspect of the invention is described with reference to the drawings. However, the embodiment described below is merely an example of the invention in all respects. Various improvements and modifications can be made without departing from the scope of the invention. That is, in carrying out the invention, a specific configuration according to the embodiment may be adopted as appropriate.

[Embodiment 1]

Figure 1:
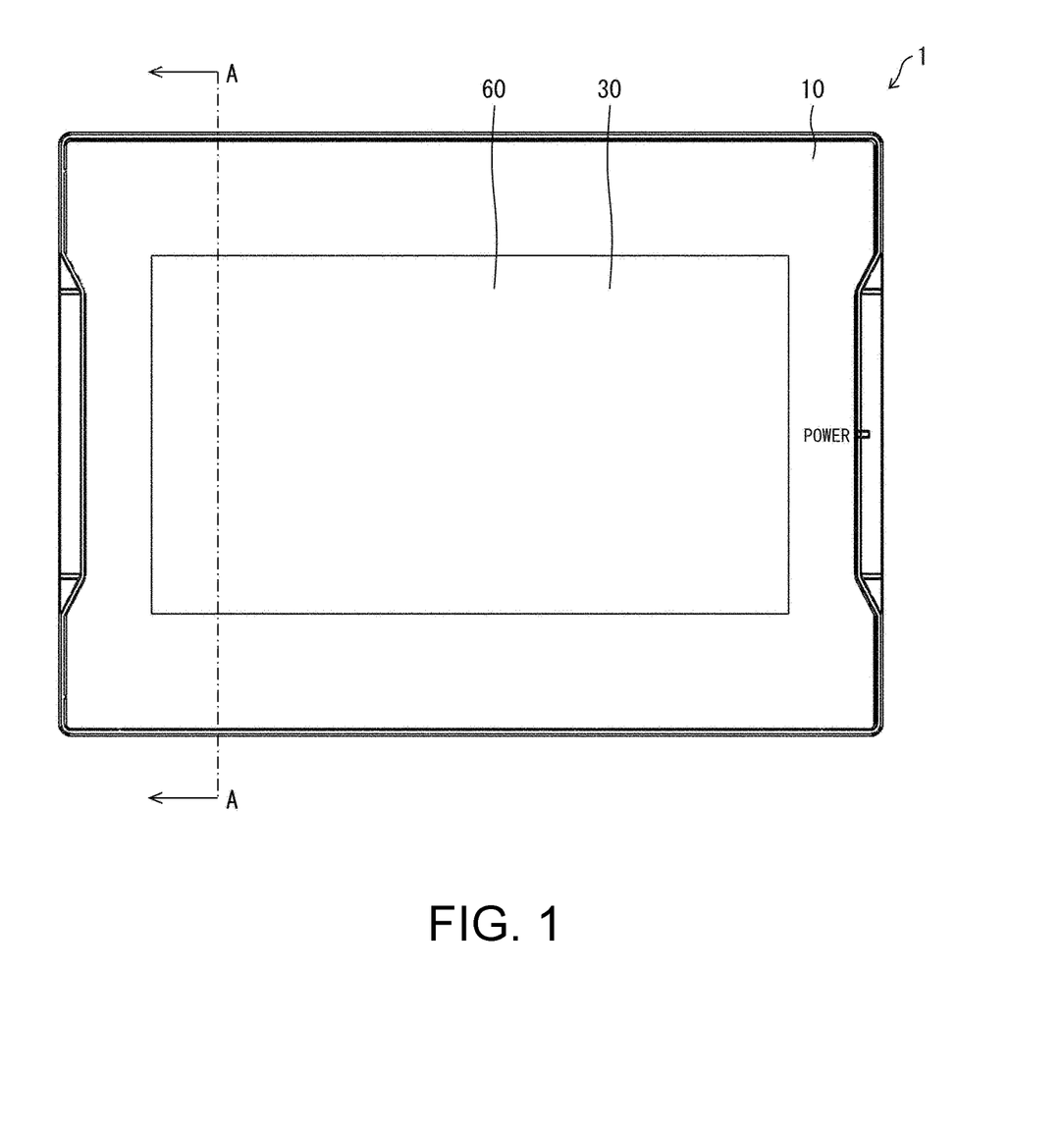
FIG. 1 is a front view illustrating an information display apparatus according to an embodiment of the invention.
Figure 2:
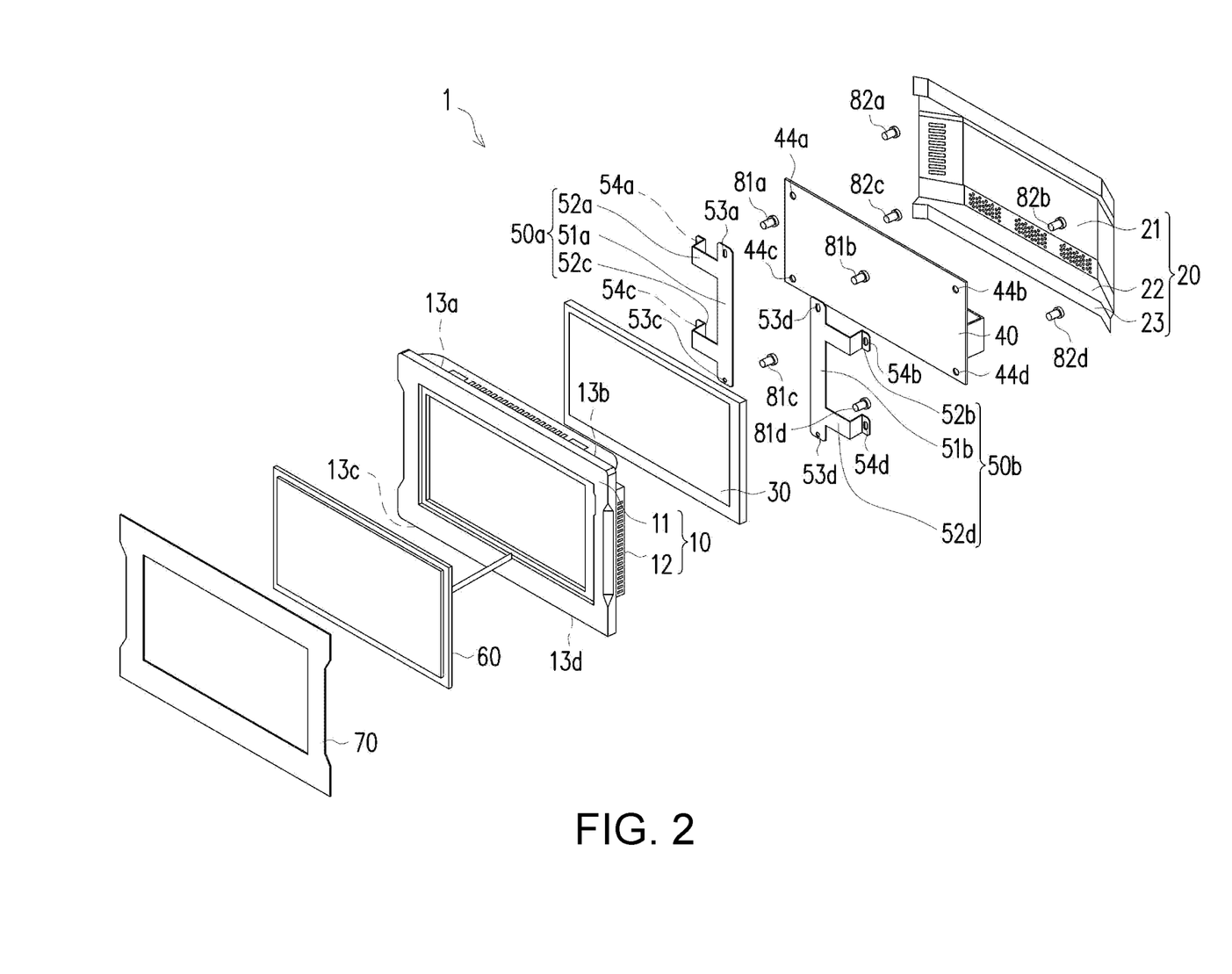
FIG. 2 is an exploded perspective view of the information display apparatus.
Figure 3:
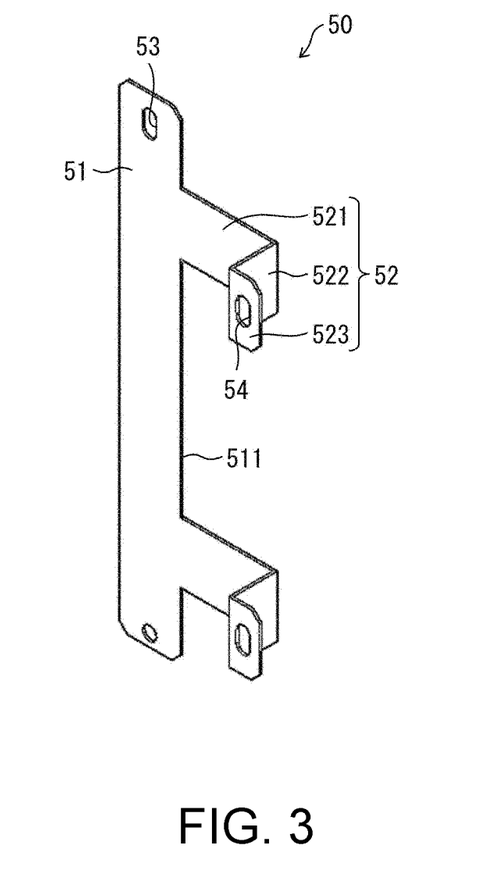
FIG. 3 is an enlarged perspective view of a fixing part of the information display apparatus.

FIG. 1 is a front view illustrating an information display apparatus 1 according to an embodiment of the invention. FIG. 2 is an exploded perspective view of the information display apparatus 1. FIG. 3 is an enlarged perspective view of a fixing part 50 of the information display apparatus 1. As shown in FIGS. 1 and 2, the information display apparatus 1 includes, in an order from the side of a front case 10, a display panel 30, a pair of fixing parts 50, and a circuit substrate 40 inside a housing formed by the front case 10 and a rear case 20. The front case 10 has at least two pairs of display panel fixing boss parts 13 (boss parts).

As shown in FIG. 3, each of the fixing parts 50 has a strip-like part 51 that is straight, and a pair of branching parts 52 that branch, from a long side 511 of the strip-like part 51, in a direction intersecting with a longitudinal direction of the strip-like part 51. In each of the branching parts 52, an end part provided with a step difference with respect to the strip-like part 51 is formed.

The two end parts of each of the strip-like parts 51 are screwed to each pair of the display panel fixing boss parts 13. Accordingly, the display panel 30 is sandwiched and fixed between the pair of fixing parts 50 and the front case 10. In addition, the circuit substrate 40 is screwed to each of the two pairs of branching parts 52. Accordingly, the circuit substrate 40 is fixed to the pair of fixing parts 50.

According to the application example, an information display apparatus in which the weight can be reduced, and the respective main components (the front case 10, the display panel 30, the fixing parts 50, and the circuit substrate 40) are firmly fixed to each other can be realized.

The information display apparatus 1 according to the embodiment, for example, verifies the operation and the setting content of each apparatus in a factory automation (FA) system and is suitable as a human machine interface (HMI) for inputting various setting contents to each apparatus in the FA system. In the following, the information display apparatus 1, as an example of such HMI, displaying a display image indicating the operation and the setting content of each apparatus by using the display panel 30 and receiving a touch operation from a user by using a touch panel 60 is described.

As shown in FIGS. 1 and 2, the information display apparatus 1 includes the front case 10, the rear case 20, the display panel 30, the circuit substrate 40, the pair of fixing parts 50, the touch panel 60, and a front sheet 70. In the following, in the information display apparatus 1, the side where the front case 10 is located is the front, the side where the rear case 20 is located is the rear, the left side when facing the rear is the left, and the right side when facing the rear is the right.

The front case 10 has a frame part 11 formed to surround a rectangular opening, and a rising part 12 rising rearward from the outer edge of the frame part 11. A concave part for insertion of the touch panel 60 to be described afterwards is formed on the front surface of the frame part 11. In addition, two pairs of display panel fixing boss parts 13a to 13d protruding rearward are provided on the back surface of the frame part 11. Specifically, the pair of display panel fixing boss parts 13a and 13c are provided on the top and the bottom of the left end of the frame part 11 from the center. In addition, the pair of display panel fixing boss parts 13b and 13d are provided on the top and the bottom of the right end of the frame part 11 from the center. At the display panel fixing boss part 13, a screw hole for insertion of a screw 81 is formed forward from a protruding direction end part. In the specification, when it is not necessary to specifically distinguish the two pairs of display panel fixing boss parts 13a to 13d, these components are simply referred to as the display penal fixing boss parts 13. The same applies to other components in pair.

The rear case 20 has a bottom part 21, rising parts 22 respectively rising forward from the outer edges of the upper end and the lower end of the bottom part 21, and end parts 23 respectively extending upward and downward from the front ends of the rising parts 22. The front case 10 and the rear case 20 are components forming the housing of the information display apparatus 1. The front case 10 and the rear case 20 are, for example, connected by screwing hole parts (not shown) provided at the end parts 23 and boss parts (not shown) provided on the back surface of the frame part 11, so that the end parts 23 are brought into contact with the inner surface of the rising part 12.

The display panel 30 is disposed behind the front case 10 inside the housing formed by the front case 10 and the rear case 20. The display panel 30, for example, is a liquid crystal display (LCD), an organic electro-luminescence (EL) display panel, etc.

The pair of fixing parts 50 are provided behind the display panel 30 inside the housing formed by the front case 10 and the rear case 20. As shown in FIGS. 2 and 3, each of the fixing parts 50 has the strip-like part 51 that is straight, and the pair of branching parts 52 that branch, from the long side 511 of the strip-like part 51, in a direction intersecting with the longitudinal direction of the strip-like part 51. In one pair of branching parts 52, end parts provided with step differences with respect to the strip-like part 51 are formed. For example, the branching part 52 has a first extension part 521, a second extension part 522 (step difference), and a third extension part 523 (end part) (see FIG. 3). The first extension part 521 extends substantially in parallel with the main surface of the strip-like part 51 from the long side 511. The second extension part 522 extends rearward from the tip of the first extension part 521. The third extension part 523 extends substantially in parallel with the main surface of the strip-like part 51 from the tip of the second extension part 522. In addition, strip-like part side hole parts 53 are provided at two end parts of the strip-like part 51. In addition, branching part side hole parts 54 are provided at the pair of branching parts 52 (third extension parts 523). The fixing part 50 may also be formed by bending a sheet-like member (e.g., a sheet metal member).

The two end parts of the strip-like part 51 are screwed to the display panel fixing boss parts 13 by the screws 81. Accordingly, the display panel 30 is sandwiched and fixed between the pair of fixing parts 50 and the front case 10. A cushion material for filling a gap between the display panel 30 and the front case 10 may also be attached to the front surface of the display panel 30 and/or the back surface of the frame part 11. Accordingly, the pressure from the pair of fixing parts 50 with respect to the display panel 30 can be suppressed. In addition, the rattling of the display panel 30 due to the gap can be reduced, and the display panel 30 can be firmly fixed.

As an example shown in FIG. 2, the pair of fixing parts 50 include a fixing part 50a disposed on the left and a fixing part 50b disposed on the right. Strip-like side hole parts 53a and 53c respectively screwed to the display panel fixing boss parts 13a and 13c are provided at the upper end and the lower end of the strip-like part 51a in the fixing part 50a. Strip-like side hole parts 53b and 53d respectively screwed to the display panel fixing boss parts 13b and 13d are provided at the upper end and the lower end of the strip-like part 51b in the fixing part 50b. Screws 81a to 81d respectively pass through the strip-like part side hole parts 53a to 53d and fastened to the screw holes of the two pairs of display panel fixing boss parts 13a to 13d.

The circuit substrate 40 is provided behind the pair of fixing parts 50 to be described afterwards inside the housing formed by the front case 10 and the rear case 20. The circuit substrate 40 is rectangular, and includes electronic components on the front surface. The four corners of the circuit substrate 40 are respectively provided with four circuit substrate fixing hole parts 44a to 44d. Specifically, the circuit substrate fixing hole parts 44a and 44b are respectively provided at the left end and the right end on the upper side of the circuit substrate 40. In addition, the circuit substrate fixing hole parts 44c and 44d are respectively provided at the left end and the right end on the lower side of the circuit substrate 40.

The circuit substrate fixing hole parts 44 are screwed to the branching parts 52 by screws 82. Accordingly, the circuit substrate 40 is fixed to the fixing parts 50. As an example in FIG. 2, the circuit substrate fixing hole parts 44a and 44c are respectively screwed to the branching part side hole parts 54a and 54c provided at the pair of branching parts 52a and 52c respectively branching from the upper end and the lower end of the fixing part 50a. In addition, the circuit substrate fixing hole parts 44b and 44d are respectively screwed to the branching part side hole parts 54b and 54d provided at the pair of branching parts 52b and 52d respectively branching from the upper end and the lower end of the fixing part 50b. Screws 82a to 82d are respectively inserted into the circuit substrate fixing hole parts 44a to 44d and the branching part side hole parts 54a to 54d and fastened through a conventional process.

The touch panel 60 is fit into the concave part formed on the front surface of the frame part 11. In addition, the front sheet 70 is attached to the front surface of the frame part 11 to protect the touch panel 60.

(Comparative Example)

Figure 6:
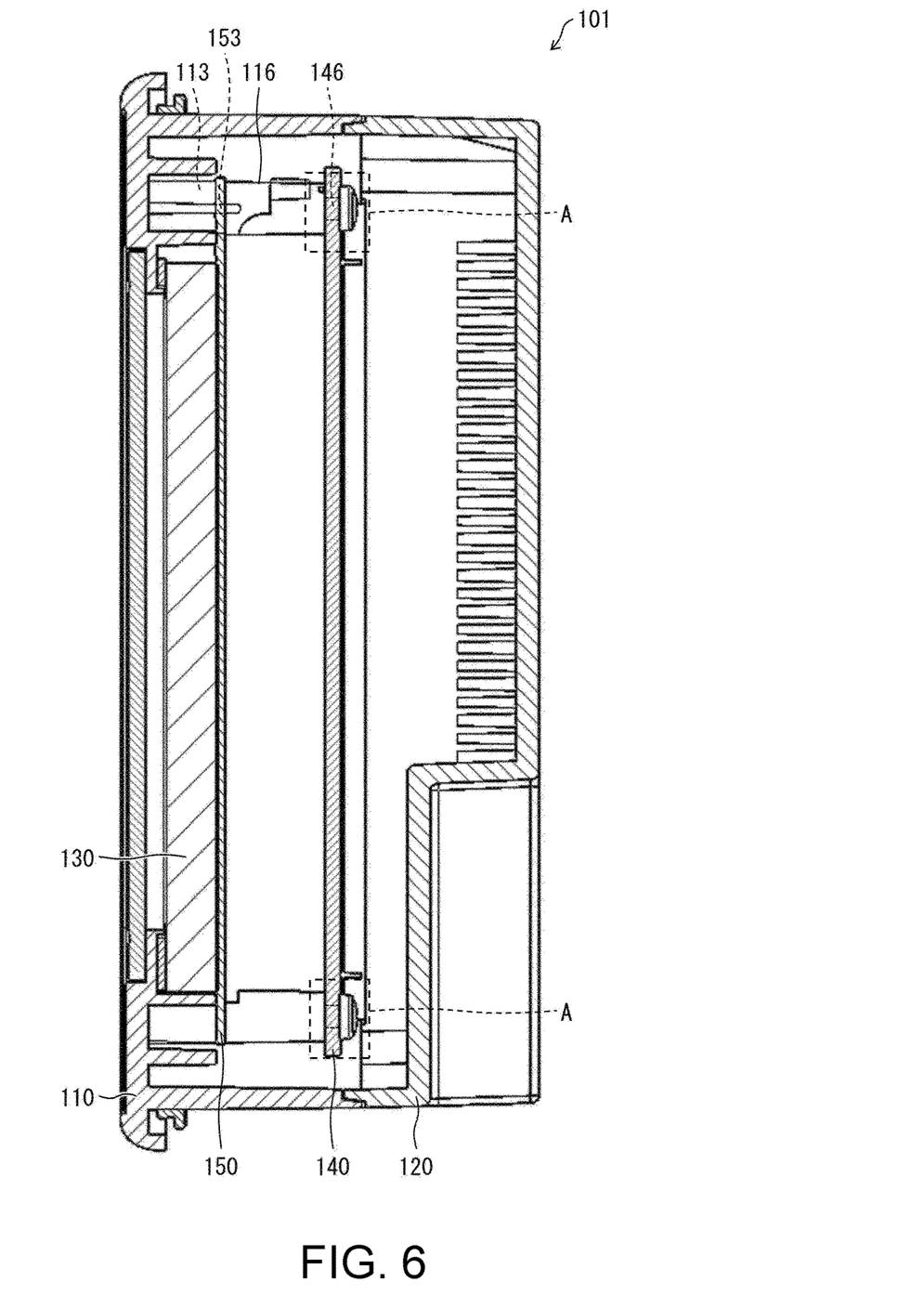
FIG. 6 is a cross-sectional view illustrating an information display apparatus according to a comparative example at a cross-section orthogonal to the left-right direction.
Figure 7:
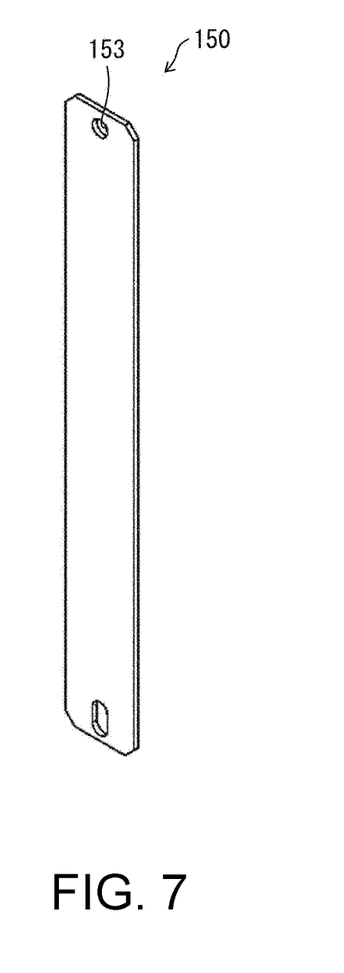
FIG. 7 is an enlarged perspective view of a fixing part of the information display apparatus according to the comparative example.

In the following, a configuration of an information display apparatus 101 according to the comparative example is described with reference to FIGS. 6 and 7. FIG. 6 is a cross-sectional view illustrating the information display apparatus 101 according to a comparative example at a cross-section orthogonal to the left-right direction. FIG. 7 is an enlarged perspective view of a fixing part 150 of the information display apparatus 101 according to the comparative example. As shown in FIG. 6, the information display apparatus 101 includes, in an order from the side of a front case 110, a display panel 130, a fixing part 150, and a circuit substrate 140 inside a housing formed by the front case 110 and a rear case 120. A display panel fixing boss part 113 provided at the front case 110 and a display panel fixing hole part 153 provided at the fixing part 150 are screwed (see also FIG. 7). Accordingly, the display panel 130 is sandwiched and fixed between the fixing part 150 and the front case 110. In addition, a circuit substrate fixing boss part 116 provided at the front case 110 and a circuit substrate fixing hole part 146 provided at the circuit substrate 140 are screwed. Accordingly, in the information display apparatus 101 of the comparative example, a configuration in which the circuit substrate 140 is directly and firmly fixed to the front case 110 can be formed.

Here, the circuit substrate fixing boss part 116 is provided on the outer periphery side with respect to the display panel 130 to protrude toward the circuit substrate 140. That is, the location (area A surrounded by the dot line of FIG. 6) where the front case 110 and the circuit substrate 140 are screwed needs to be located on the outer periphery side with respect to the display panel 130. Therefore, in order to cover the screwed location, it is necessary to form the rear case 120 in a box shape without a sense of slimness, and the appearance of the information display apparatus 101 is less preferable.

Figure 4:
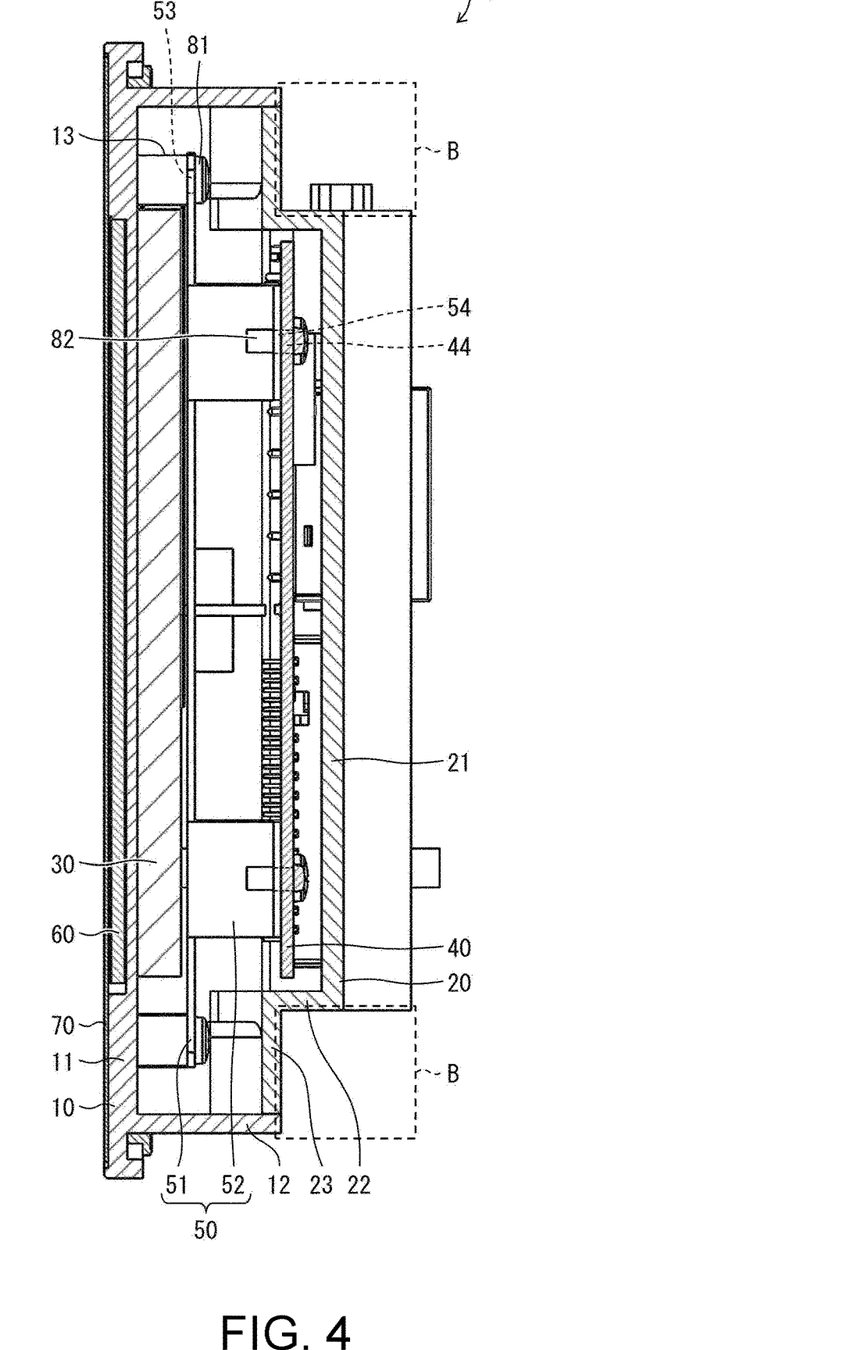
FIG. 4 is a cross-sectional view illustrating the information display apparatus and taken along a cross-sectional line A shown in FIG. 1.
Figure 5:
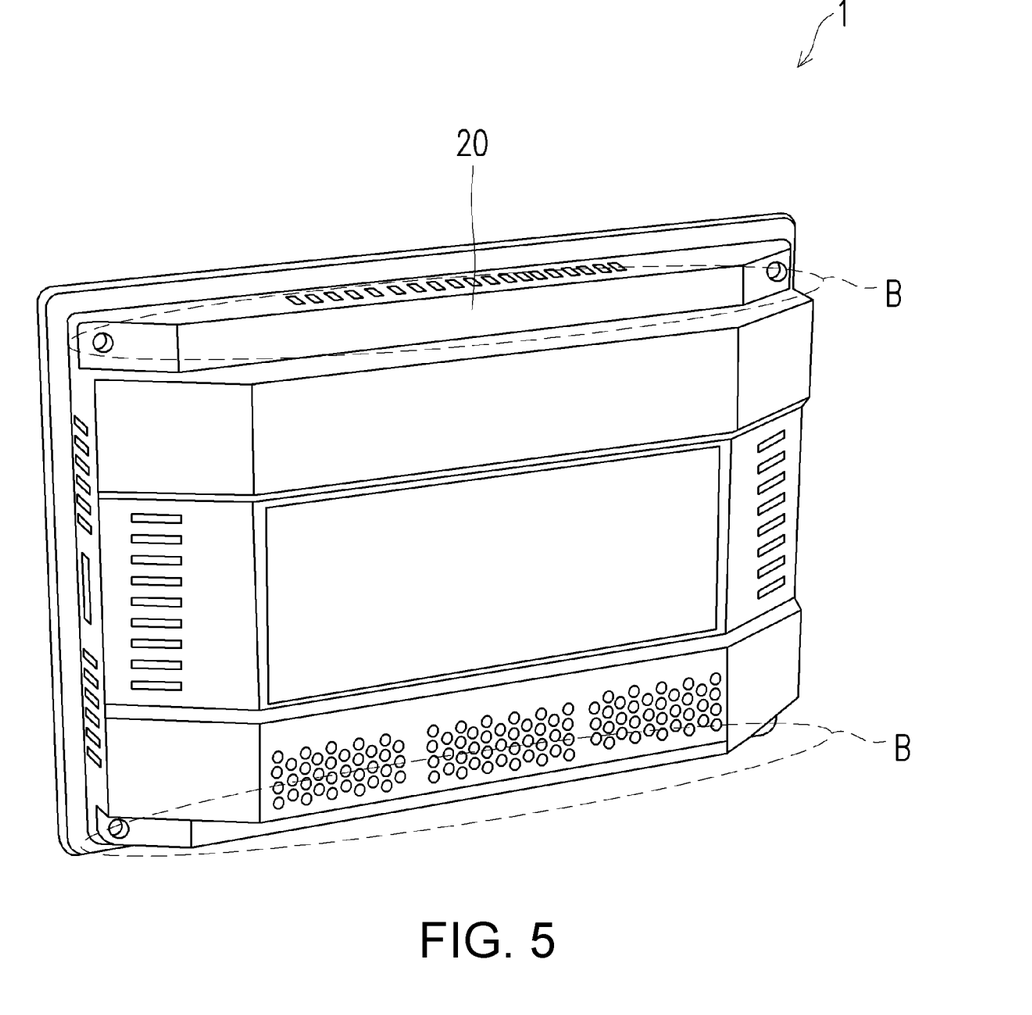
FIG. 5 is a back view of the information display apparatus.

FIG. 4 is a cross-sectional view illustrating the information display apparatus 1 and taken along a cross-sectional line A shown in FIG. 1. FIG. 5 is a back view of the information display apparatus 1. As shown in FIG. 4, in the information display apparatus 1 according to the embodiment, the branching parts 52 for fixing the circuit substrate 40 is provided, in place of the circuit substrate fixing boss part 116 (see FIG. 6) according to the comparative example, at the fixing parts 50. That is, the circuit substrate 40 is fixed to the fixing parts 50 by inserting and fastening the screws 82 to the circuit substrate fixing hole parts 44 and the branching part side hole parts 54.

Here, it is not necessary to consider the location of the display panel 30 for the places where the fixing parts 50 and the circuit substrate 40 are screwed. Therefore, the places where the fixing parts 50 and the circuit substrate 40 are screwed are provided on the inner side with respect to the places (the places of the display panel fixing boss parts 13) where the fixing parts 50 and the front case 10 are screwed in the upper-lower direction of the housing. Therefore, the upper-lower width at the bottom part 21 of the rear case 20 covering the circuit substrate 40 from the rear can be reduced with respect to the upper-lower width in the frame part 11 of the front case 10 having the display panel fixing boss parts 13. This means that, compared with the boxshaped rear case 120 (see FIG. 6) according to the comparative example, the upper and lower end parts (areas B surrounded by dot lines in FIGS. 4 and 5) of the rear case 20 according to the embodiment can be slim. That is, by applying the fixing parts 50 serving to fix the circuit substrate 40, the size of the housing of the information display apparatus 1 can be reduced.

In addition, the fixing parts 50 according to the embodiment are a pair of strip-like brackets each having the strip-like part 51 that is straight and the pair of branching parts 52. Therefore, compared with the sheet-like bracket covering the display panel as used in the conventional information display apparatus, the weight of the fixing parts 50 can be reduced. In addition, the strip-like parts 51 of the pair of fixing parts 50 are respectively screwed to the display panel fixing boss parts 13 provided at the top and the bottom of the front case 10. Therefore, the display panel 30 can be effectively pressed down and firmly fixed. In addition, by contacting the third extension parts 523 of the fixing parts 50 firmly fixed to the front case 10, the circuit substrate 40 are directly screwed at four places. Therefore, the circuit substrate 40 can be indirectly and firmly fixed to the front case 10. Therefore, the information display apparatus 1 in which the weight can be reduced, and the respective main components (the front case 10, the display panel 30, the fixing parts 50, and the circuit substrate 40) are firmly fixed to each other can be realized.

In addition, since step differences are formed at the branching parts 52, the third extension parts 523 are located behind the strip-like parts 51. Thus, by screwing the fixing parts 50 to the front case 10 and the circuit substrate 40, a space considering the height of the electronic components mounted on the circuit substrate 40 and the influences of the heat generated by the electronic components can be easily ensured between the display panel 30 and the circuit substrate 40.

In the embodiment, an example in which the fixing parts 50 have four strip-like part side holes 53a to 53d and four branching part side holes 54a to 54d is described. However, the numbers of the strip-like part side holes 53 and the branching part side holes 54 are not limited thereto. In addition, in correspondence with the numbers of the strip-like part side holes 53 and the branching part side holes 54, the numbers of the display panel fixing boss parts 13 and the circuit substrate fixing hole parts 44 may also be respectively changed.

The invention is not limited to the above-described embodiments, and various modifications can be made within the scope of the claims. The technical scope of the invention also includes embodiments obtained by appropriately combining the technical means disclosed in the different embodiments.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An information display apparatus, comprising:
   a front case;
   a rear case, connected with the front case; and
   a display panel, a pair of fixing parts, and a circuit substrate provided inside a housing formed by the front case and the rear case,
   wherein the display panel is disposed behind the front case,
   the pair of fixing parts are disposed behind the display panel, and
   the circuit substrate is disposed behind the fixing parts,
   wherein each of the fixing parts has:
      a strip-like part that is straight; and
      a pair of branching parts, which branch from a long side of the strip-like part in a direction intersecting with a longitudinal direction of the strip-like part and in which end parts provided with step differences with respect to the strip-like part are formed, wherein each of the branching parts has a first extension part, a second extension part constituting the step difference, and a third extension part being the end part, wherein the first extension part extends substantially in parallel with a main surface of the strip-like part from the long side, the second extension part extends rearward from a tip of the first extension part, and the third extension part extends substantially in parallel with the main surface of the strip-like part from a tip of the second extension part,
   wherein two end parts of each of the strip-like parts are respectively screwed to the front case, thereby sandwiching and fixing the display panel between the pair of fixing parts and the front case, and
   the circuit substrate is fixed to the pair of fixing parts by being screwed to the two pairs of branching parts respectively.

2. The information display apparatus as claimed in claim 1, wherein the two end parts of the strip-like part are screwed in a direction toward the front case.

3. The information display apparatus as claimed in claim 2, wherein the front case has at least two pairs of boss parts, and
   the two end parts of each of the strip-like parts are respectively screwed to one pair of the boss parts.

4. The information display apparatus as claimed in claim 1, wherein the fixing part is formed by bending a sheet-like member.

5. The information display apparatus as claimed in claim 2, wherein the fixing part is formed by bending a sheet-like member.

6. The information display apparatus as claimed in claim 3, wherein the fixing part is formed by bending a sheet-like member.

* * * * *